United States Patent
Jeung

(10) Patent No.: US 7,449,921 B2
(45) Date of Patent: Nov. 11, 2008

(54) APPARATUS AND METHOD REDUCING GLITCH IN SWITCHING DEVICE

(75) Inventor: Jin-hyuk Jeung, Dongdaemun-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 72 days.

(21) Appl. No.: 11/707,896

(22) Filed: Feb. 20, 2007

(65) Prior Publication Data
US 2007/0200614 A1   Aug. 30, 2007

(30) Foreign Application Priority Data
Feb. 25, 2006   (KR)   .................. 10-2006-0018521

(51) Int. Cl.
*G01R 29/02* (2006.01)
(52) U.S. Cl. .................. 327/34; 341/144; 341/145
(58) Field of Classification Search .................. 327/34; 341/144, 145
See application file for complete search history.

(56) References Cited

U.S. PATENT DOCUMENTS 6,304,199 B1 * 10/2001 Fang et al. .................. 341/118
6,344,816 B1 * 2/2002 Dedic .................. 341/144

FOREIGN PATENT DOCUMENTS

| JP | 10-209875 | 8/1998 |
| KR | 1995-24439 | 8/1995 |
| KR | 1020040099883 A | 12/2004 |
| KR | 1020040099887 A | 12/2004 |

* cited by examiner

*Primary Examiner*—Kenneth B. Wells
(74) *Attorney, Agent, or Firm*—Volentine & Whitt, PLLC

(57) ABSTRACT

Provided are an apparatus and method of reducing a glitch in a switching device. The apparatus includes a latch latching a digital input signal and providing a digital output signal, a switching device segment unit including at least two switching device segment units, each one of the at least two switching device segment units switching a portion of the digital signal output, a glitch detection unit detecting a glitch generated within the switching device segment unit; and a voltage/current converter generating a latch control signal in response to an output from the glitch detection unit associated with a detected glitch, the latch control signal controlling an overlap of the digital output signal to reduce the glitch.

9 Claims, 3 Drawing Sheets

APPARATUS AND METHOD REDUCING GLITCH IN SWITCHING DEVICE

BACKGROUND OF THE INVENTION

1. Field of the Invention

The present invention relates to switching devices. More particularly, the invention relates to a segmented glitch reduction apparatus for a switching device and a related method of operating the switching device.

This application claims the benefit of Korean Patent Application No. 10-2006-0018521, filed on Feb. 25, 2006, the subject matter of is hereby incorporated by reference.

2. Description of the Related Art

Contemporary electronics increasing include integrated circuits adapted to process both digital and analog signals. This capability is critical to ongoing efforts to reduce the overall size of integrated circuits forming consumer electronic products, such as cell phones. The coincidental processing of both digital and analog signals within a single integrated circuit necessitates the use of a class of high definition circuits referred to as analog-to-digital converters (ADC) and digital-to-analog converters (DAC). A DAC receives one or more digital signal(s), decodes the digital signal, and converts the decoded digital signal into a corresponding analog signal. In so doing, a DAC may adjust an output level of the analog signal in accordance with the input value of the digital signal.

DACs and ADCs are common types of switching circuits. Many switching circuits are segmented in their manner of operation. That is, they process data by dividing it into portions and then processing the data portions separately.

Conventional segmented switching devices have many uses, but also suffer from certain problems. For example, segmented DACs suffer from noise induced errors caused by "glitches." A glitch is an erroneous signal transition commonly caused, for example, by mistimed data transitions, noisy circuit operations (e.g., flip-flop transitions), external signal interference, etc. Closely related to the effects of common signal (or data) glitches in segmented switching devices are so-called differential nonlinearity (DNL) errors.

SUMMARY OF THE INVENTION

Embodiments of the invention provide a glitch reduction apparatus for a switching device, such as DAC which also improves differential nonlinearity (DNL) errors.

BRIEF DESCRIPTION OF THE DRAWINGS

Figure (FIG.) 1 is a block diagram of a glitch reduction apparatus for a switching device according to an embodiment of the invention.

DESCRIPTION OF EMBODIMENTS

Hereinafter, a glitch reduction apparatus for a switching device and a related method of operating the switching device according to an embodiment of the invention will be described with reference to the drawings.

Figure 1:
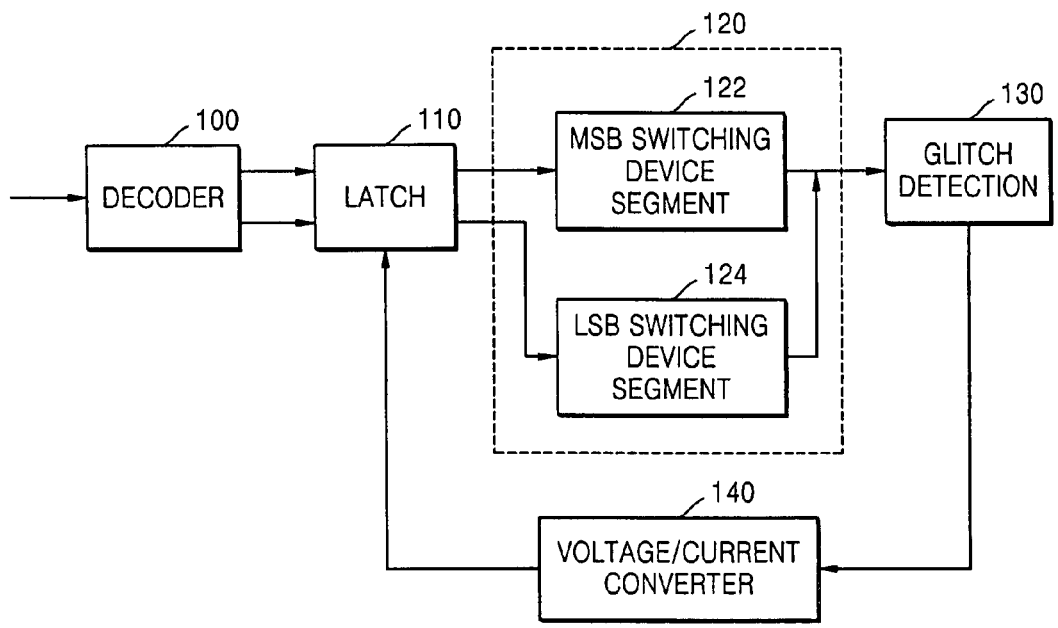

FIG. 1 is a block diagram of a glitch reduction apparatus for a switching device according to an embodiment of the invention. Referring to FIG. 1, the glitch reduction apparatus includes a latch 110, a switching device segment unit 120, a glitch detection unit 130, and a voltage/current converter 140. The illustrated embodiment further includes an optionally provided decoder 100.

Decoder 100 is conventional in its implementation and is adapted to decode one or more applied digital signal(s). Latch 110 is also conventional in its implementation and latches the decoded digital signal received from decoder 100.

Switching device segment unit 120 switches the digital signal output from latch 110, and includes at least two switching device segments. In the illustrated embodiment, switching device segment unit 120 includes a MSB switching device segment 122 and a LSB switching device segment 124. MSB switching device segment 122 is assigned to a group of upper order bits, and LSB switching device segment 124 is assigned to a group of lower order bits.

Figure 5:
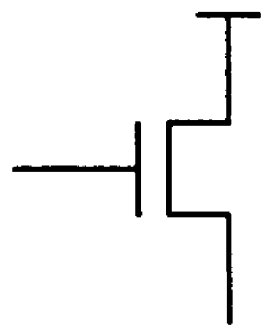
FIG. 5 illustrates a current mirror susceptible to incorporation within a glitch detection unit according to an embodiment of the present invention.
Figure 6:
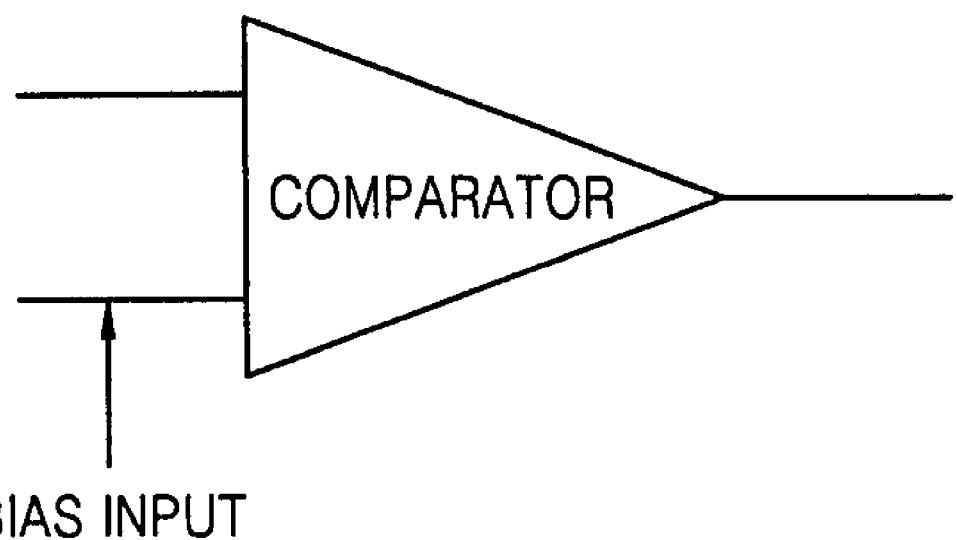
FIG. 6 illustrates a comparator susceptible to incorporation within a glitch detection unit according to another embodiment of the present invention.

Glitch detection unit 130 detects glitches generated within switching device segment unit 120. One possible embodiment of glitch detection unit 130, a simple current mirror, is shown in FIG. 5. This specific embodiment detects glitch current, but other conventionally under stood embodiments may be used to detect glitch current or glitch voltage. For example, another embodiment of glitch detection unit 130 is shown in FIG. 6. The comparator shown in FIG. 6 detects a glitch voltage and outputs a control signal if the glitch voltage is greater than a predetermined voltage threshold.

Voltage/current (V/I) converter 140 drives a latch control signal applied to latch 110. This control signal adjusts the timing overlap of data segments (i.e., the MSB and LSB bits) output from 110. Overlap control reduces the occurrence and/or size of a glitch detected by glitch detection unit 130. In embodiments of the invention where the latch control signal is generated as a voltage output signal from glitch detection unit 130, a voltage to current conversion may be performed.

Figure 2:
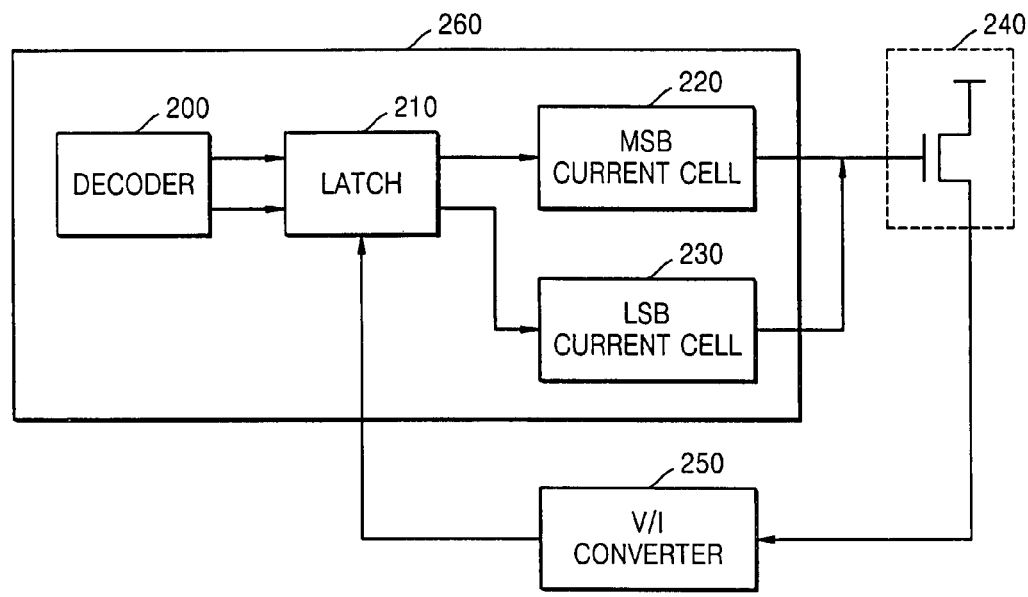
FIG. 2 is a block diagram of a digital-to-analog converter (DAC) to which an embodiment of the invention has been applied.
Figure 4:
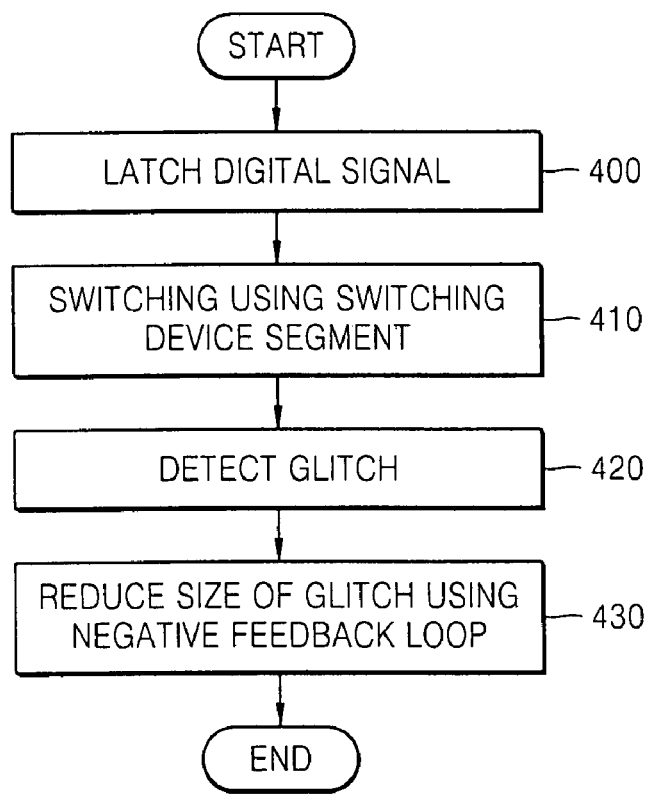
FIG. 4 is a flowchart summarizing a glitch reduction method according to an embodiment of the invention.

FIG. 2 is a block diagram of one specific type of DAC to which an embodiment of the invention has been applied. The DAC includes a basic segmented DAC block 260 and a feedback block 240 which detects a DAC output as a current or voltage. FIG. 4 is a flowchart summarizing a glitch reduction method performed by the switching device according to an embodiment of the invention.

Referring collectively to FIGS. 2 and 4, decoder 200 receives an input digital signal of the DAC and generates a digital code that controls switching within the DAC cells. The digital code is latched in latch 210 (operation 400) and a non-overlapping or overlapping clock signal is generated. Switching is performed in switching device segments 220 and 230 in response to the non-overlapping or overlapping clock signal (operation 410). Here, the size of a glitch will depend, at least in part, on the amplitude of an overlapping clock signal. The size of the glitch is detected as a current or voltage (operation 420), and a negative feedback loop is formed to reduce the size of the glitch. That is, a latch control signal is fed-back to adjust a bias voltage applied to latch 210 through V/I converter 250. The bias voltage controls a delay applied to the overlapping clock signal and reduces the glitch.

Figure 3:
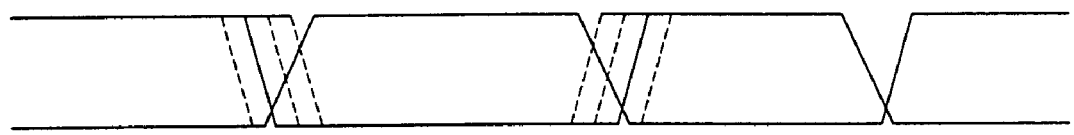
FIG. 3 is a waveform diagram illustrating an overlapping clock duty cycle for a latch controlled by a bias voltage.

FIG. 3 illustrates overlapping clock duty cycles in a latch controlled by a bias voltage. Referring to FIG. 3, when the duty of an overlapping clock signal of a latch is controlled by a bias voltage, the degree of overlap of the clock signal can be varied. The actual delay of the latch may depend on its geometric position on a constituent substrate, as well as variances in applicable manufacturing processes. Accordingly, the negative feedback loop influences a differential nonlinearity (DNL) characteristic of the DAC and is used to detect the size of such a glitch, thus reducing the size of the glitch.

In a glitch reduction apparatus and method according to embodiments of the present invention, it is possible to reduce a glitch generated at the output of a segmented switching device and improve its DNL characteristics.

While the invention has been particularly shown and described with reference to exemplary embodiments, it will be understood by those of ordinary skill in the art that various changes in form and details may be made therein without departing from the scope of the present invention as defined by the following claims.

What is claimed is:

1. A glitch reduction apparatus for a switching device, comprising:
    a latch latching a digital input signal and providing a digital output signal;
    a switching device segment unit comprising at least two switching device segment units, each one of the at least two switching device segment units switching a portion of the digital output signal;
    a glitch detection unit detecting a glitch generated within the switching device segment unit; and
    a voltage/current converter generating a latch control signal in response to an output from the glitch detection unit associated with a detected glitch, the latch control signal controlling an overlap of the digital output signal to reduce the glitch.

2. The glitch reduction apparatus of claim 1, further comprising:
    a decoder decoding a received digital signal and providing the digital input signal to the latch.

3. The glitch reduction apparatus of claim 2, wherein the switching device segment unit comprises:
    a MSB switching device segment assigned to a group of upper order bits; and
    a LSB switching device segment assigned to a group of lower order bits.

4. The glitch reduction apparatus of claim 1, wherein the glitch detection unit is a current mirror detecting glitch current.

5. The glitch reduction apparatus of claim 1, wherein the glitch detection unit is a comparator detecting glitch voltage and generating an output if the glitch voltage is greater than a predetermined threshold voltage.

6. A method of operating a switching device, comprising:
    latching a digital input signal and providing a digital output signal;
    segmenting the digital output signal into a plurality of digital output signal portions and respectively switching each one of the plurality of digital output signal portions in a corresponding plurality of switching device segment units;
    detecting a glitch generated within the plurality of switching device segment units and generating a glitch detection output signal; and
    controlling an overlap of the digital output signal using a negative feedback loop responsive to the glitch detection output signal.

7. The method of claim 6, further comprising:
    decoding a receiver digital signal to generate the digital input signal.

8. The method of claim 7, wherein the plurality of digital output signal portions comprises a group of upper order bits and a group of lower order bits, and wherein the plurality of switching device segment units comprises a MSB switching device segment assigned to the group of upper order bits and a LSB switching device segment assigned to the group of lower order bits.

9. The method of claim 8, further comprising:
    performing a voltage to current conversion on the glitch detection output signal within the negative feedback loop.

* * * * *